(12) United States Patent
Foley

(10) Patent No.: US 6,514,774 B1
(45) Date of Patent: Feb. 4, 2003

(54) METHOD OF FABRICATION OF STEP EDGE

(75) Inventor: Cathy Foley, Linfield (AU)

(73) Assignee: Commonwealth Scientific and Industrial Research Organisation, Australian Capital Territory (AU)

(*) Notice: Subject to any disclaimer, the term of this patent is extended or adjusted under 35 U.S.C. 154(b) by 0 days.

(21) Appl. No.: 09/787,166

(22) PCT Filed: Sep. 14, 1999

(86) PCT No.: PCT/AU99/00774
§ 371 (c)(1),
(2), (4) Date: Jun. 20, 2001

(87) PCT Pub. No.: WO00/16414
PCT Pub. Date: Mar. 23, 2000

(30) Foreign Application Priority Data

Sep. 14, 1998 (AU) .............................................. PP 5907

(51) Int. Cl.⁷ .............................................. H01L 21/00
(52) U.S. Cl. ........................................................... 438/2
(58) Field of Search ........................... 438/2, 706, 735, 438/977, 978; 216/3, 22, 74

(56) References Cited

U.S. PATENT DOCUMENTS 4,966,885 A * 10/1990 Hebard
5,358,928 A   10/1994 Ginley et al.

FOREIGN PATENT DOCUMENTS

EP           0660428        6/1995

OTHER PUBLICATIONS

Doerrer, L. et al., "High Tc thin film Josephson junctions", Applied Superconductivity, 1 (10–12), 1992, pp. 1665–1673.*

Ramos, J. et al., "YBCO Josephson junctions on directionally ion beam etched MgO substrates", Appl. Phys. Lett. 63 (15), 1993, pp. 2141 to 2143.*

Derwent Abstract Accession No.: 94–262486/32, SE 9203489, May 20, 1994.

Derwent Abstract Accession No. 95–173951/23, JP 07–094794, Apr. 7, 1995.

D.H.A. Blank et al., "Characterization of Ramp–type $YBa_2CU_3O_7$ Junctions by AFM", IEEE Transactions on Applied Superconductivity, vol. 7, No. 2, pp. 3323–3326, Jun. 1997.

J. Ramos et al., "$YBa_2Cu_3O_7$ Josephson junctions on directionally ion beam etched MgO substrates", American Institute of Physics, pp. 2141–2143, Oct. 1993.

L. Doerrer et al., "High T Thin Film Josephsone Junctions and DC–SQUIDs", Applied Superconductivity, vol. 1, No. 10–12, pp. 1665–1673, 1993.

* cited by examiner

Primary Examiner—Keith Christianson
(74) Attorney, Agent, or Firm—Baker Botts LLP

(57) ABSTRACT

A method of forming a step edge in a surface 12 of a crystalline substrate 10, comprising the steps of forming a layer of resist 11 over the surface 12 and removing areas of the resist 11 to expose selected areas of the surface 12, thereby forming side walls 13 in the layer of the resist 11, the side walls 13 bounding the exposed areas of the surface 12. The method further comprises exposing the resist 11 and substrate 10 to an ion beam 14, thereby etching the resist 11 and the exposed areas of the surface 12, and controlling the orientation and angle of incidence of the ion beam 14 which respect to the substrate 10 and the resist side walls 13 to form a step edge with desired angle and height characteristics. An angular position of the substrate 10 about an axis 15 formed by a normal to the surface 12 is controlled in order to control the step edge formation.

25 Claims, 6 Drawing Sheets

METHOD OF FABRICATION OF STEP EDGE

TECHNICAL FIELD

The present invention relates to the construction of circuits including a substrate, and in particular provides a method of forming a step edge in a substrate.

BACKGROUND ART

Superconducting materials are currently finding applications in a number of areas. For example, superconducting quantum interference devices (SQUIDS) have applications in geophysical mineral prospecting.

In many instances it is desired to form features in the surface of a substrate to alter or control physical or electrical aspects of circuits constructed over the substrate. For example, a 'step edge' in the surface of the substrate is commonly required in the construction of circuits.

A common circuit element in superconducting devices is the Josephson Junction. Which may be formed in a variety of ways. Josephson Junctions are commonly implemented by forming the superconducting material over a step edge in a substrate. However, characteristics of the junction, such as the critical density, can be difficult to control.

DISCLOSURE OF INVENTION

Throughout the following, the terms 'superconducting material', 'superconducting device' and the like are used to refer to a material or device which, in a certain state and at a certain temperature, is capable of exhibiting superconductivity. The use of such terms does not imply that the material or device exhibits superconductivity in all states or at all temperatures.

From a first aspect the present invention provides a method of forming a step edge in a surface of a crystalline substrate, comprising the steps of:

forming a layer of resist over the surface;

removing areas of the resist to expose selected areas of the surface, thereby forming side walls in the layer of the resist the side walls bounding the exposed areas of the surface: and exposing the resist and substrate to an ion beam, thereby etching the resist and the exposed areas of the surface;

wherein the angles between an axis of incidence of the ion beam and the surface, and between the axis of incidence of the ion beam and the resist side walls, are selected in order to form a step edge with predetermined angle and height characteristics, and wherein an angular position of the axis of incidence of the ion beam about an axis formed by a normal to the surface is selected in order to control the step edge formation.

The selection of the angular position of the axis of incidence of the ion beam about the axis formed by the normal to the surface may be made in order to control or alter an etch rate of the substrate, for example by controlling or altering an incidence of the ion beam relative to channels in a lattice of the crystalline substrate.

The resist side wall is preferably at an angle to the surface of the substrate of greater than 70 degrees, and even more preferably greater than 80 degrees. Most preferably, the resist side wall is substantially, perpendicular to the surface of the substrate.

The angle of the resist side wall may be optimised by controlling the steps involved in formation of the layer of resist and the removal of areas of the resist, namely hot plate temperature, pre-exposure development, exposure time, UV light intensity, post exposure baking temperature and development time.

In embodiments where the angle of the step edge is desired to be large, the method of the invention may further comprise the steps of:

orientating the ion beam such that the angle between the axis of incidence of the ion beam and a plane of the resist side wall is minimised, thereby minimising an etch rate of the resist side wall; and altering the angle between the axis of incidence of the ion beam and the surface in order to control an etch rate of the substrate.

Alternative embodiments, in which the angle of the step edge is desired to be low, may further comprise the steps of:

orientating the ion beam such that the angle between the axis of incidence of the ion beam and a plane of the resist side wall is sufficiently large to cause an etch rate of the resist side wall to be increased; and altering the angle between the axis of incidence of the ion beam and the surface in order to control an etch rate of the substrate.

During a period of time in which the resist and substrate are exposed to the ion beam, both the substrate and the resist side wall will be etched by the ion beam. Consequently, the resist side wall will gradually recede from the exposed areas of the surface, thereby exposing further areas of the surface to the ion beam. The further areas of the substrate surface will be exposed to the ion beam for a reduced amount of time, and therefore the substrate will be less deeply etched in these areas, forming the step edge of a certain angle.

The angle of the step edge may be controlled in order to obtain predetermined characteristics in a circuit subsequently constructed over the substrate. For example, a high temperature superconductor may later be formed over the substrate, with a Josephson junction being formed over the step edge. By forming a step edge having a predetermined angle, the critical current of the Josephson junction may, to some extent. be selected.

The substrate used in preferred embodiments of the invention is a single crystal MgO (100) substrate.

The step of removing areas of the resist is preferably performed by photolithography.

The resist and substrate are preferably exposed to an argon ion beam.

The method of the first aspect of the invention preferably comprises the preliminary step of:

providing a smooth substrate surface, for example by polishing the surface of the substrate.

The substrate preferably has a surface roughness of less than 0.4 nm.

The method of the first aspect of the invention preferably comprises the subsequent steps of:

removing all of the resist; and cleaning the surface of the substrate to smoothen irregularities in the surface and to remove any debris that may have been created during previous steps.

A height of the step edge may be influenced by controlling a time for which the surface and resist are exposed to the ion beam.

Preferably, the method of the first aspect of the invention provides a step edge suitable for forming a Josephson junction in a superconducting material, having a single grain boundary at the upper part of the step edge, and a rounded step base.

The superconducting material is preferably $YBa_2Cu_3O_x$ (YBCO), where x has a value of 6 to 7. YBCO is advantageous in the present method because it grows over an MgO substrate such that its c-axis remains substantially perpendicular to the underlying substrate, enabling grain boundaries to be created in the YBCO HTSC layer. Consequently, in cases where a Josephson junction is constructed over the step edge, the critical current of the junction may be controlled by the angle of the step edge, and by the number of misorientation angles that are formed in the step.

BRIEF DESCRIPTION OF THE DRAWINGS

Embodiments of the invention will now be described by way of example with reference to the accompanying drawings in which.

MODES FOR CARRYING OUT THE INVENTION

Figure 1:
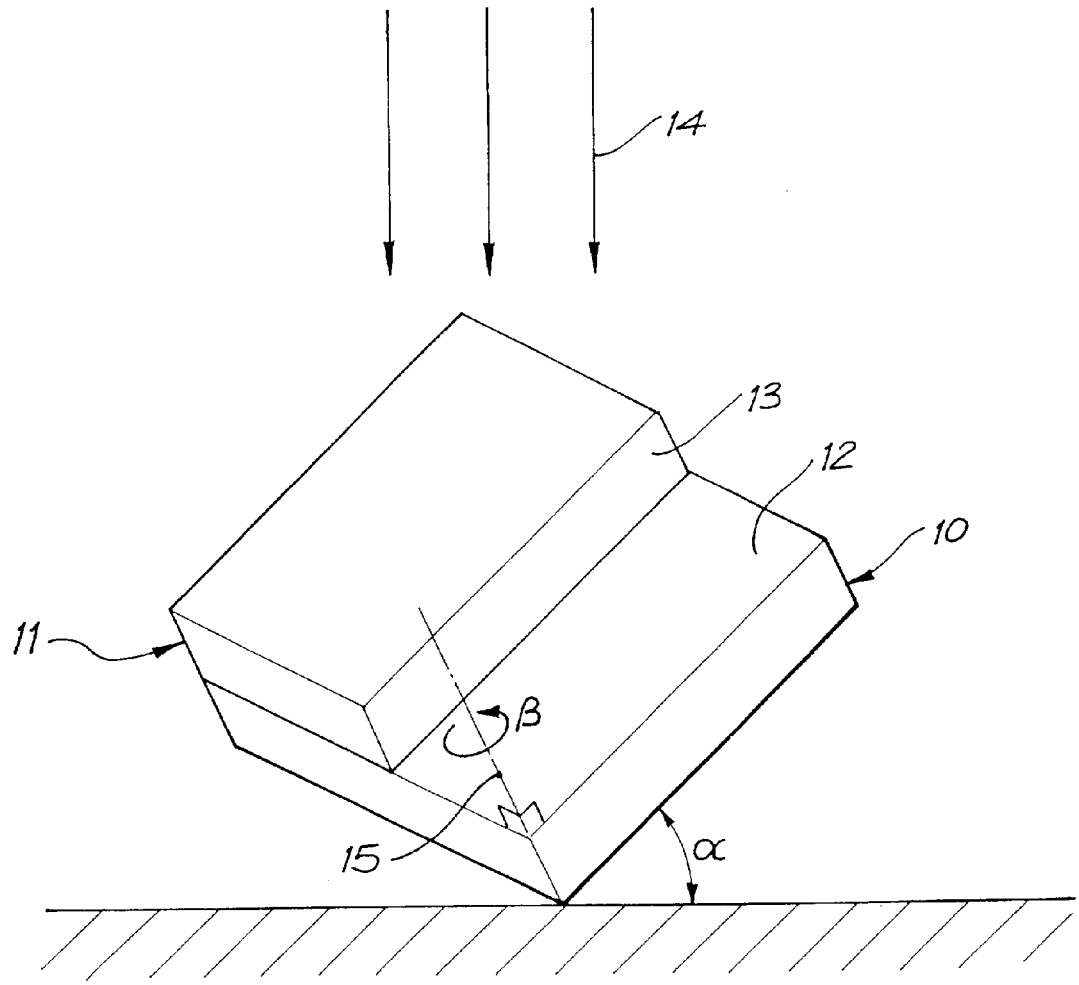
FIG. 1 shows a substrate being exposed to an ion beam in accordance with the first aspect of the present invention.

In accordance with a first aspect of the present invention, FIG. 1 shows a crystalline substrate 10 having a layer of resist 11 formed over a surface 12 of the substrate 10. Areas of the resist have been removed in order to expose an area of the surface 12, and the resist has a side wall 13 adjoining the exposed area of the surface 12. The substrate 10 and resist 12 are being exposed to an argon ion beam 14 of controlled orientation and angle of incidence with respect to the surface 12 and to the side wall 13, thereby etching the exposed areas of the surface 12 and the resist side wall 13 at controlled rates. Appropriate control of the orientation and angle of incidence of the ion beam 14 and the period of exposure, provides a step edge of desirable angle and height.

The present invention will now be described by way of example. We define α to be the angle of the substrate 10 to the ion beam 14, and β to be the angular position of the substrate 10 about an axis 15 formed by a normal to the plane of the surface 12.

Figure 2:
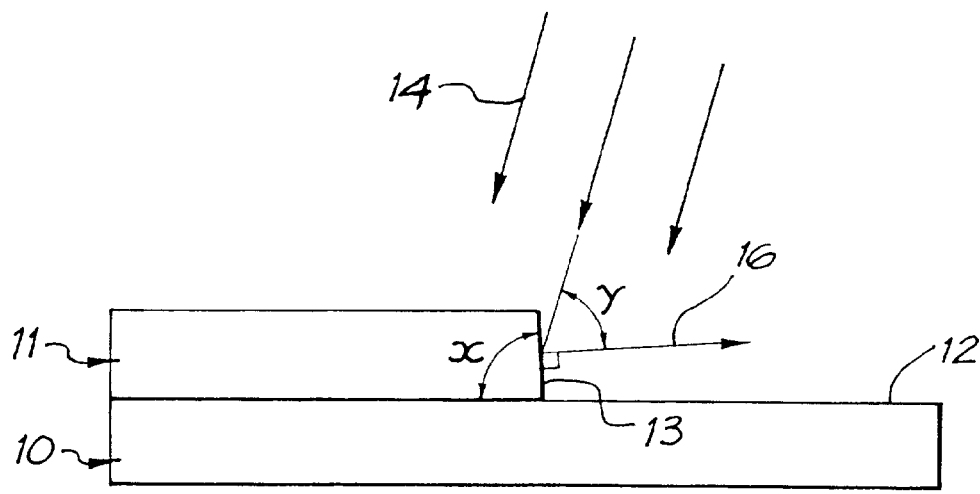
FIGS. 2 and 2a show views of the substrate of FIG. 1 before and after etching.
Figure 2A:
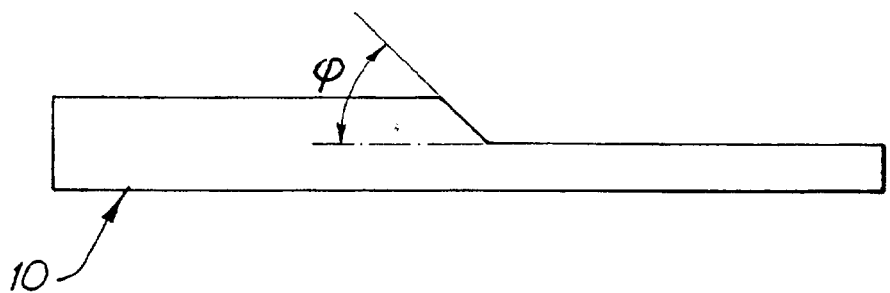
Figure 3A:
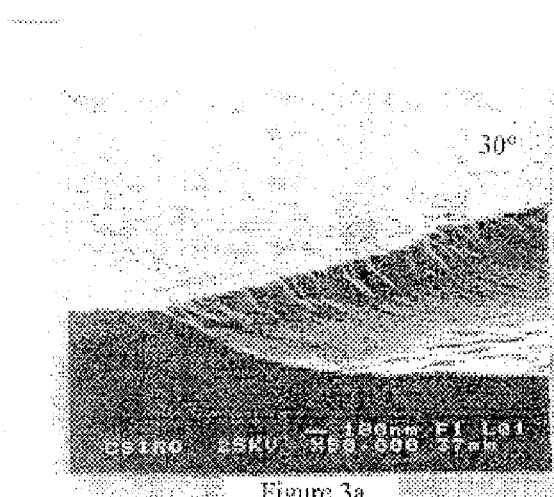
FIGS. 3a to 3e are scanning electron micrographs of the morphology of step edges formed in accordance with the present invention.
Figure 3B:
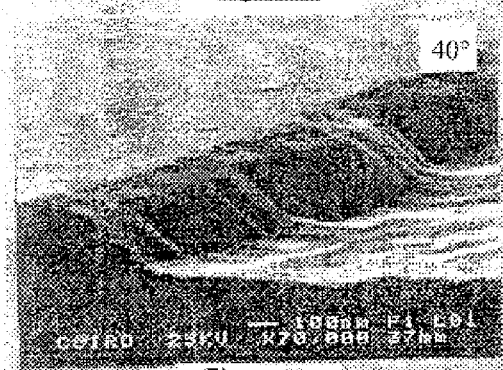
Figure 3C:
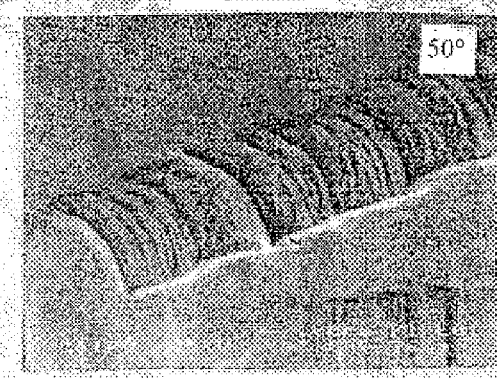
Figure 3D:
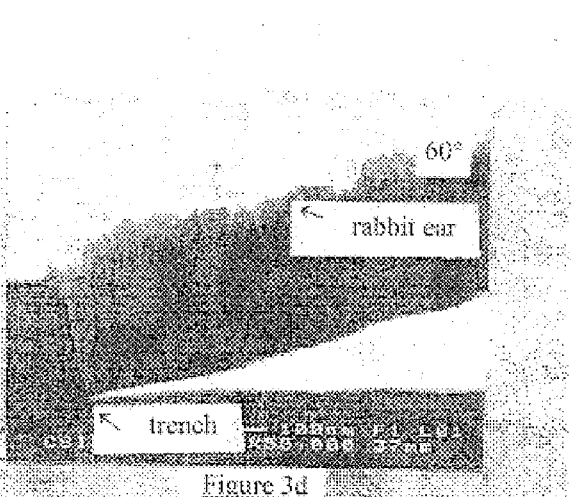
Figure 3E:
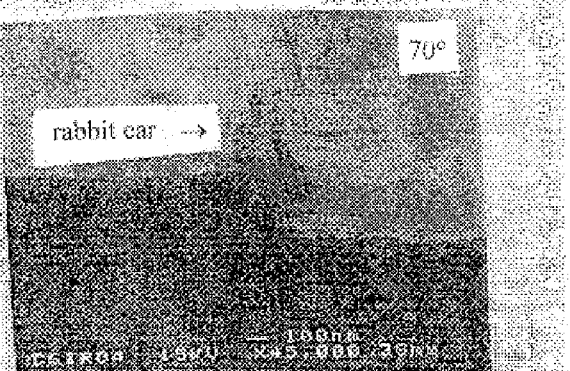

As shown in FIG. 2, resist side wall 13 is at an angle χ of between 80° and 85° to the surface 12. This angle is preferably as close as possible to 90°, and may be optimised by controlling the steps involved in formation of the layer of resist 11 and the removal of areas of the resist, namely hot plate temperature, pre-exposure development, exposure time, UV light intensity, post exposure baking temperature and development time. Resist side walls at an angle of between 80° and 85° to surface 12 are routinely achieved in this way. The argon ion beam 14 forms an angle γ with the normal 16 of the plane of the resist side wall 13.

Substrate 10 is a MgO (100) substrate polished on one side, to have a surface roughness of better than 0.4 nm. A 1.3 μm photoresist mask 11 (Shipley S98913—available from AWA Electronics, 8 Australia Ave, Homebush Bay, Sydney, Australia) is used to define the step edge. The argon ion beam is produced by a Kaufman ion gun providing a beam voltage of 500 eV and a neutralised beam current of 22 mA/cm² on a water cooled substrate holder.

In order to form a step edge of desired angle ψ, the etching rate of the substrate 10 and the etching rate of the resist side wall 13 are controlled. Our measurements indicate that the etching rates of MgO (100) and Shipley S98913 photoresist vary with incident angles, α. From normal incidence (α=0°), the etching rate increases until reaching a maximum at α=50°–60°, then decreases as larger glancing angles are approached. The initial increase in rate occurs as a consequence of the increased probability of the Ar ion collisions giving a substrate atom a component of momentum directed away from the surface 12. The reduction in etching rate at higher angles occurs because the incoming ion beam is spread over an increasingly larger surface area (the flux drops off as the cosine of the incidence angle). Also, the probability of a purely elastic reflection of the primary beam is increased at large angles of incidence.

There follows an example of the effect of altering α, while keeping γ close to the glancing angle (>70°), thereby causing a slow etch rate of the resist side wall 13. The etching rate of the MgO (100) substrate 10 is increased by raising the ion beam 14 angle of incidence from zero up to 60°–70°. Note that γ remains substantially constant as α is changed. Therefore the etch rate of the resist side walls 13 is constant, at a small value, and the etch rate of the MgO substrate 10 is altered. Consequently, it is possible to alter the ion milled surface step angle ψ. FIG. 3 shows scanning electron micrographs of the step edge morphology after the resist mask has been removed, for α varied from 30° to 70° in 10° increments. The steepness of the step edge increases with α up to 60–70°. A 'rabbit ear' is observed on the top side of the step for α=60–70°, which is due to redeposited material backsputtered from the substrate surface. This material is mostly polycrystalline and would have a deleterious effect on subsequently grown layers such as YBCO, and so is preferably cleaned off (further described below).

Figure 4:
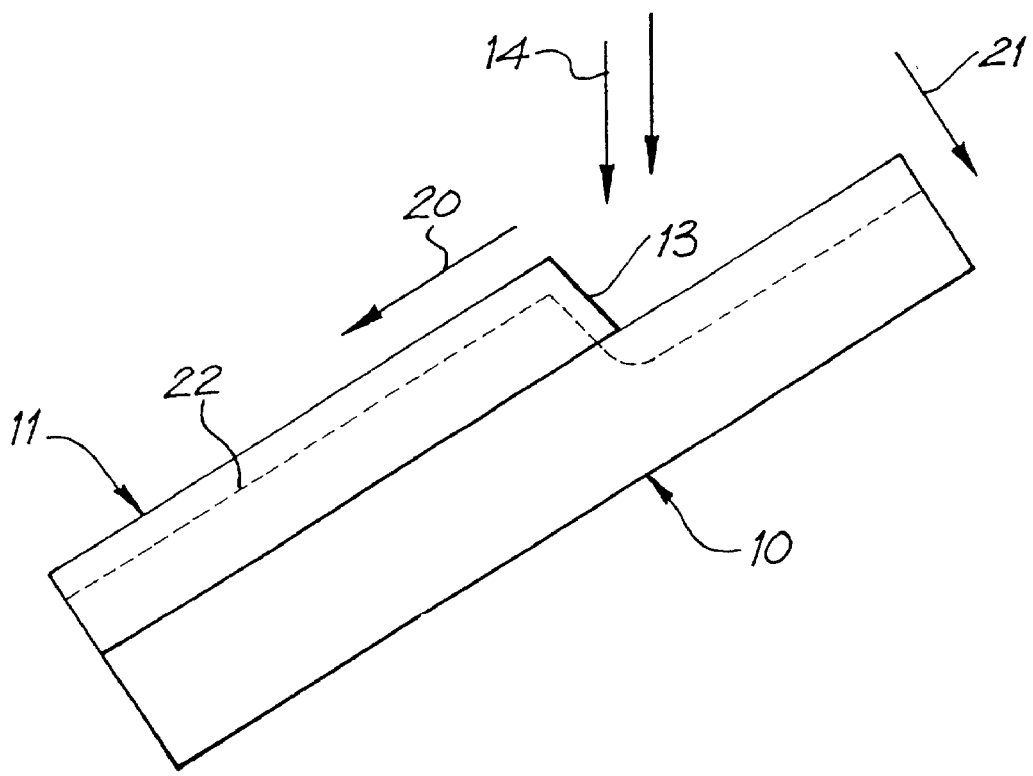
FIG. 4 illustrates the effect of simultaneous etching of the resist side wall and the substrate.
Figure 5A:
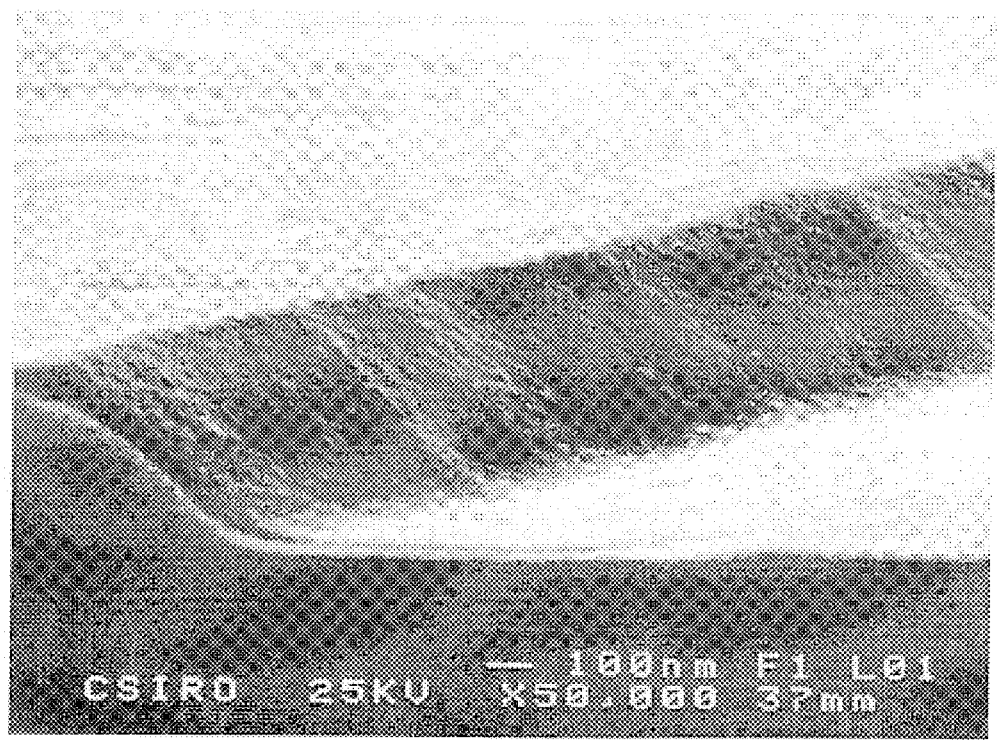
FIGS. 5a to 5d are scanning electron micrographs of the morphology of step edges which have been cleaned by a final ion beam etch.
Figure 5B:
Figure 5C:
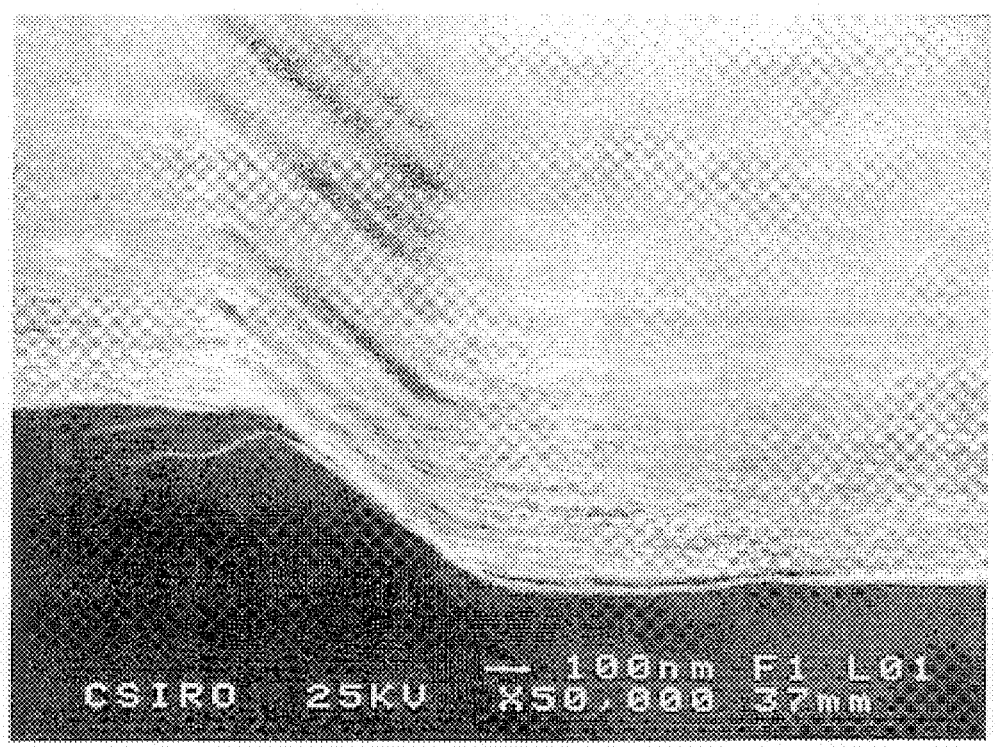
Figure 5D:

In cases where a lower step edge angle ψ is desired, γ may be reduced. This is now described by way of example. It is possible to fabricate a step edge with a moderate angle ψ by aligning the substrate 10 so that the resist side wall 13 faces into the ion beam 14. Therefore the etch rate of the resist side wall 13 will be significant. With γ now being significantly less than 90 degrees, any change in α will affect γ. Specifically, increasing α will decrease γ. As shown in FIG. 4, ion beam etching in such an orientation leads to the resist side wall 13 drawing back as shown by arrow 20 as it is etched away, simultaneously with the etching of the substrate 10 in the (100) direction as shown by arrow 21. The etch rate of the substrate 10 depends on α, whereas the etch rate of the resist side wall 13 depends on γ. Following etching, the resist and substrate will have drawn back, as shown by dotted line 22 in FIG. 4.

The step angle ψ may be influenced by altering the etch rate of the resist side wall with respect to the etch rate of the substrate. In accordance with the present invention, this may be achieved by altering β, thereby altering γ while maintaining a constant α. Moderate step angles ψ are achieved when the etch rate for the substrate 10 is approximately equal to the etch rate for the resist side wall 13. The angles of α/γ=50°/30°, 60°/20° or 70°/5° have been found to achieve a step angle of ψ=35°–40°. It has been noted that while an alteration of β does not change α, it does have a significant effect on the etch rate of the MgO crystalline substrate, but not on the etch rate of the resist, which may have an affect on the final result. For example if the etching rate of the MgO substrate 10 is too low, it may be possible to etch entirely through the photoresist and therefore etch and damage areas of the surface 12 which were not intended to be etched. If the etching rate of the MgO substrate 10 is too high, the resist side wall 13 may not draw back sufficiently to define a desired step angle.

This effect occurs because the etching rate increases at more oblique angles of incidence to a crystal structure, and material is more rapidly etched from side walls of channels formed by the crystal lattice structure.

As mentioned above, some substrate orientations lead to the formation of undesirable backsputtered debris on the surface 12, particularly near the top of the step edge. Such debris may cause unwanted misorientation angles in the step edge, for example causing increased junction noise in a Josephson junction subsequently constructed over the step edge. In preferred embodiments of the invention this debris is removed after creation of the step edge is complete and the resist has all been cleaned off the substrate. For example, the debris may be removed by a final ion beam etch, with the ion beam preferably being aligned perpendicular to the surface. Such a cleaning step may also improve the surface roughness, to provide a smoother mounting surface upon which circuits may subsequently be built. Step edges which have undergone an ion beam etch to remove debris and smoothen the surface are shown in FIG. 5.

The present method enables production of a step edge having one, two or three junctions. In the preferred case, one junction is formed by making a step edge with a rounded bottom. The step edge may form two junctions by having a sharply defined edge at the top and bottom of the step. Alternatively, the present invention may provide a step edge having three junctions, wherein a 'trench' is formed along the bottom of the step, as indicated in FIG. 3.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

What is claimed is:

1. A method of forming a step edge in a surface of a crystalline substrate, comprising the steps of:

forming a layer of resist over the surface;

removing areas of the resist to expose selected areas of the surface, thereby forming side walls in the layer of the resist, the side walls bounding the exposed areas of the surface; and exposing the resist and substrate to an ion beam, thereby etching the resist and the exposed areas of the surface;

wherein the angles between an axis of incidence of the ion beam and the surface, and between the axis of incidence of the ion beam and the resist side walls, are selected in order to form a step edge with predetermined angle and height characteristics, and wherein an angular position of the axis of incidence of the ion beam about an axis formed by a normal to the surface is selected in order to control the step edge formation.

2. The method according to claim 1 wherein the selection of the angular position of the axis of incidence of the ion beam about the axis formed by the normal to the surface is made in order to control or alter an etch rate of the substrate, by controlling or altering an incidence of the ion beam relative to channels in a lattice of the crystalline substrate.

3. The method according to claim 1 wherein the resist side wall is at an angle to the surface of the substrate of greater than 70 degrees.

4. The method according to claim 3 wherein the resist side wall is at all angle to the surface of greater than 80 degrees.

5. The method according to claim 4 wherein the resist side wall is substantially perpendicular to the surface of the substrate.

6. The method according to claim 1 wherein the angle of the resist side wall is controlled by controlling the steps involved in formation of the layer of resist and the removal of areas of the resist, namely hot plate temperature, pre-exposure development, exposure time, UV light intensity, post exposure baking temperature and development time.

7. The method according to claim 1 wherein, in order to create a step edge of large angle, the method further comprises the steps of:

orientating the ion beam such that the angle between the axis of incidence of the ion beam and a plane of the resist side wall is minimized, thereby minimizing an etch rate of the resist side wall; and altering the angle between the axis of incidence of the ion beam and the surface in order to control an etch rate of the substrate.

8. The method according to claim 1 wherein, in order to create a step edge of small angle, the method further comprises the steps of:

orientating the ion beam and a plane of the resist side wall is sufficiently large to cause an etch rate of the resist side wall to be increased; and altering the angle between the axis of incidence of the ion beam and the surface in order to control an etch rate of the substrate.

9. The method according to claim 1 wherein the angle of the step edge is controlled in order to obtain predetermined characteristics in a circuit subsequently constructed over the substrate.

10. The method according to claim 9 wherein the circuit exhibits high temperature superconductivity.

11. The method according to claim 9 wherein a Josephson junction is formed over the step edge.

12. The method according to claim 11 wherein the critical current of the Josephson junction is controllably altered by altering the angle of the step edge.

13. The method according to claim 1 wherein the substrate is a single crystal MgO (100) substrate.

14. The method according to claim 1 wherein the step of removing areas of the resist is performed by photolithography.

15. The method according to claim 1 wherein the resist and substrate are exposed to an argon ion beam.

16. The method according to claim 1 wherein the method comprises the preliminary step of:

providing a smooth substrate surface.

17. The method according to claim 16 wherein the smooth substrate surface is provided by polishing the surface of the substrate.

18. The method according to claim 1 wherein the substrate has a surface roughness of less than 0.4 nm.

19. The method according to claim 1 wherein the method comprises the subsequent steps of:

removing all of the resist; and cleaning the surface of the substrate to smoothen irregularities in the surface and to remove and debris that may have been created during previous steps of the method.

20. The method according to claim 1 wherein a height of the step edge is influenced by controlling a time for which the surface and resist are exposed to the ion beam.

21. The method according to claim 1 wherein the method provides a step edge suitable for forming a Josephson junction in a superconducting material.

22. The method according to claim 1 wherein the method provides a step edge suitable for forming a Josephson junction in a superconducting material, having a single grain boundary at the upper part of the step edge, and a rounded step base.

23. The method according to claim 1 wherein a superconducting material which grows with its c-axis substantially perpendicular to the substrate is deposited over the substrate.

24. The method according to claim 1 wherein $YBa_2Cu_3Ox$ is deposited over the substrate, x being in the range of 6 to 7.

25. The method according to claim 1 wherein a number of misorientation angles and the angle of the step edge control a critical current of a Josephson junction.

* * * * *

UNITED STATES PATENT AND TRADEMARK OFFICE
CERTIFICATE OF CORRECTION

PATENT NO. : 6,514,774 B1
DATED : February 4, 2003
INVENTOR(S) : Foley, Cathy

It is certified that error appears in the above-identified patent and that said Letters Patent is hereby corrected as shown below:

Title page,
Item [56], "D.H.A. Blank et al.," reference "YBa$_2$CU$_3$O$_7$" should read -- YBa$_2$Cu$_3$O$_7$ --; and "Doerrer, L. et al.," reference "Tc" should read -- T$_c$ --; and "L. Doerrer et al.," "T" should read -- T$_c$ --; and "Josephsone" should read -- Josephson --
Item [57], ABSTRACT,
Line 10, "which" should read -- with --

Column 1,
Line 45, "surface;" should read -- surface, --
Line 64, "substantially, perpendicular" should read -- substantially perpendicular --

Column 2,
Line 40, "extent." should read -- extent, --

Column 4,
Line 3, "angle ψ," should read -- angle φ, --
Line 19, "7" should read -- γ --
Line 27, "angle ψ." should read -- angle φ. --
Lines 37, 41 and 54, "angle ψ" should read -- angle φ --
Line 44, "a" should read -- α --
Line 58, "angles ψ" should read -- angles φ --
Line 62, "ψ=35°–40°" should read -- φ=35°–40° --

Column 5,
Line 49, "surface;" should read -- surface, --

Column 6,
Line 24, "beam and" should read -- beam such that the angle between the axis of incidence of the ion beam and --

UNITED STATES PATENT AND TRADEMARK OFFICE
CERTIFICATE OF CORRECTION

PATENT NO.    : 6,514,774 B1
DATED         : February 4, 2003
INVENTOR(S)   : Foley, Cathy It is certified that error appears in the above-identified patent and that said Letters Patent is hereby corrected as shown below:

<u>Column 8,</u>
Line 2, "Ox" should read -- $O_x$ --
Line 4, "a number" should read -- one or more --

Signed and Sealed this

Sixth Day of April, 2004

JON W. DUDAS
*Acting Director of the United States Patent and Trademark Office*